(12) United States Patent
Heine

(10) Patent No.: US 10,606,146 B2
(45) Date of Patent: Mar. 31, 2020

(54) BEAM ORIENTATION IN UNIDIRECTIONAL OPTICAL COMMUNICATION SYSTEMS

(71) Applicant: Tesat-Spacecom GmbH & Co. KG, Backnang (DE)

(72) Inventor: Frank Heine, Mainhardt (DE)

(73) Assignee: Tesat-Spacecom GmbH & Co. KG (DE)

( * ) Notice: Subject to any disclaimer, the term of this patent is extended or adjusted under 35 U.S.C. 154(b) by 0 days.

(21) Appl. No.: 16/163,762

(22) Filed: Oct. 18, 2018

(65) Prior Publication Data

US 2019/0163030 A1 May 30, 2019

(30) Foreign Application Priority Data

Nov. 24, 2017 (DE) ........................ 10 2017 127 913

(51) Int. Cl.
*G02F 1/29* (2006.01)
*H01S 5/40* (2006.01)
(Continued)

(52) U.S. Cl.
CPC ......... *G02F 1/292* (2013.01); *G02B 27/0927* (2013.01); *H01S 5/4075* (2013.01); *H04B 10/118* (2013.01); *H04B 10/503* (2013.01)

(58) Field of Classification Search
CPC ... G02F 1/292; G02B 27/0927; H01S 5/4075; H04B 10/118; H04B 10/503; G01B 11/14; G01S 5/12; G01S 5/00; G01S 5/16
(Continued)

(56) References Cited

U.S. PATENT DOCUMENTS 6,297,897 B1 * 10/2001 Czichy ................. H04B 10/118
                                                                    398/122
7,215,890 B2 * 5/2007 Tegge, Jr. .......... H04B 10/1125
                                                                    398/123
(Continued)

FOREIGN PATENT DOCUMENTS

DE         601 00 824 T2   7/2004
DE    10 2012 012 898 A1   1/2014
(Continued)

*Primary Examiner* — Abbas H Alagheband
(74) *Attorney, Agent, or Firm* — Lerner, David, Littenberg, Krumholz & Mentlik, LLP

(57) ABSTRACT

A method for adjusting a radiation direction of an optical communication signal between a communication platform and a remote station includes: starting from an initial position of a beam deflection unit of the platform for steering the optical communication signal, adopting deflection positions of the beam deflection unit along two different lines of movement and in opposite directions along the lines of movement, the deflection positions being consistent with deflection angles having the same absolute value, each deflection position being held for a different period; measuring an intensity of the signal at the station; when an intensity change in the signal is discovered at the station, ascertaining a signal quality change in the signal and recording the duration of this intensity change; determining that intensity change that pertains to the best signal quality change, and the associated duration; changing the intensity of a guidance beam for the duration previously determined.

10 Claims, 3 Drawing Sheets

(51) Int. Cl.
*G02B 27/09* (2006.01)
*H04B 10/118* (2013.01)
*H04B 10/50* (2013.01)

(58) Field of Classification Search
USPC ............................................. 398/118
See application file for complete search history.

(56) References Cited

U.S. PATENT DOCUMENTS

| | | | | |
|---|---|---|---|---|
| 9,217,632 B2* | 12/2015 | Heine | ................... | G01B 11/14 |
| 9,651,417 B2* | 5/2017 | Shpunt | ................... | G06T 15/00 |
| 9,876,567 B2* | 1/2018 | Dickson | ............. | H04B 10/1125 |
| 9,991,957 B2* | 6/2018 | Thangavelautham | ....................... | |
| | | | | H04B 10/118 |
| 10,003,168 B1* | 6/2018 | Villeneuve | ............. | G02B 27/10 |
| 10,211,593 B1* | 2/2019 | Lingvay | ................ | G02B 27/10 |
| 2005/0069324 A1* | 3/2005 | Tegge, Jr. | .......... | H04B 10/1125 |
| | | | | 398/118 |
| 2009/0202254 A1* | 8/2009 | Majumdar | ......... | H04B 10/1123 |
| | | | | 398/140 |
| 2010/0134867 A1* | 6/2010 | Gugel | ................ | G02B 21/0064 |
| | | | | 359/287 |
| 2012/0134007 A1* | 5/2012 | Gugel | ................ | G02B 21/0064 |
| | | | | 359/287 |
| 2015/0215040 A1* | 7/2015 | Dickson | ............. | H04B 10/1125 |
| | | | | 398/131 |
| 2016/0282594 A1* | 9/2016 | Acosta | ................. | G01J 3/0237 |
| 2017/0023753 A1* | 1/2017 | Vail | ...................... | H04B 10/503 |
| 2018/0173000 A1* | 6/2018 | Rothberg | ................. | G02B 6/34 |

FOREIGN PATENT DOCUMENTS

| | | |
|---|---|---|
| EP | 0 317 373 A2 | 5/1989 |
| EP | 1154591 A2 | 11/2001 |
| EP | 2 680 024 A2 | 1/2014 |

\* cited by examiner

BEAM ORIENTATION IN UNIDIRECTIONAL OPTICAL COMMUNICATION SYSTEMS

FIELD OF THE INVENTION

The invention relates generally to the field of optical signal transmission, for example between a mobile platform and a remote station, in particular between a satellite and a remote station. In particular, the invention relates to a communication platform and a communication system having a communication platform and a remote station and also to a method for adjusting a radiation direction of an optical communication signal between a communication platform and a remote station.

BACKGROUND OF THE INVENTION

Laser communication units (also: laser communication terminal, LCT) need to keep the orientation of the transmitted beam in relation to the reception direction or in relation to the position of the remote station stable in a precise manner over some time (from several minutes to days). This is necessary in order to ensure a high level of signal quality for the received signal at the remote station.

The divergence of optical laser communication systems is normally a few rad, and a misorientation of the transmitted beam in relation to the received beam of a few rad therefore quickly results in severe losses on the transmission link. Additionally, moving laser communication systems require the direction of the transmission layer to be changed slightly, in comparison with the direction of the received light (a few μrad to 100 μrad), in order to compensate for effects of propagation delays. This angle can be referred to as a compensation angle or lead angle. This angle is usually known, but is actively regulated (with a small bandwidth) for longer transmission links so that no additional losses arise on the transmission link. In general, the transmission direction differs from the reception direction over time (several minutes) as a result of thermomechanical effects, even if they have been calibrated using suitable means before connection setup.

DE 10 2012 012 898 A1 and EP 2 680 024 A3 describe a system and a method for determining the position of a communication platform in the form of a satellite.

BRIEF SUMMARY OF THE INVENTION

An aspect of the invention may improve the orientation of an optical communication signal from a unidirectional communication platform.

According to one aspect, a communication platform is specified. The communication platform has an emitter, an intensity detector, a beam deflection unit, an actuator and a control unit. The emitter is designed for generating an optical communication signal. The intensity detector is designed for detecting the intensity of a guidance beam. The beam deflection unit is designed for steering the optical communication signal in the direction of a remote station. The actuator is designed for rotating the beam deflection unit about a pivot point. The control unit is designed for actuating the actuator. The control unit is further designed to actuate the actuator such that the optical communication signal is deflected by the beam deflection unit in a first direction along a first line of movement for a prescribed first period and is subsequently deflected in a second direction along the first line of movement, opposite to the first direction of the first line of movement, for a prescribed second period. Additionally, the control unit is designed to actuate the actuator such that subsequently the optical communication signal is deflected by the beam deflection unit in a first direction along a second line of movement for a prescribed third period and is subsequently deflected in a second direction along the second line of movement, opposite to the first direction of the second line of movement, for a prescribed fourth period. Additionally, the control unit is designed to obtain an intensity of the guidance beam as detected by the intensity detector and to take the detected intensity as a basis for determining a deflection direction of the beam deflection unit along the first line of movement or the second line of movement and to put the beam deflection unit into a deflection position.

The optical communication signal is in particular a laser signal and is used to transmit information from the communication platform to a remote station. In order to be able to detect and hold a position of the remote station, the remote station emits a guidance beam that the communication platform can use to orient an optical system to the remote station.

The emitter generates the optical communication signal on the basis of a data stream to be transmitted. The optical communication signal is radiated to the beam deflection unit and rerouted by the beam deflection unit. The beam deflection unit is, by way of example, a two-dimensional element designed to reflect the optical communication signal. In terms of function, the beam deflection unit is thus a mirror. The beam deflection unit is mounted at a pivot point and permits movement with at least two degrees of freedom. In particular, the beam deflection unit can be swivelled in two different directions. The movement of the beam deflection unit allows the reflected optical communication signal to be oriented to the remote station. The actuator is coupled to the beam deflection unit such that a force can be transmitted to the beam deflection unit, so that the beam deflection unit is brought into a desired position.

It is conceivable for the beam deflection unit to have two beam deflection elements connected in succession. In this variant, each beam deflection element can be rotated in only one direction, that is to say has only a single degree of rotational freedom. However, the directions in which the two beam deflection elements can be swivelled or rotated differ, which means that an optical beam can be deflected in two different directions. Preferably, the swivel directions of the two beam deflection elements are orthogonal in relation to one another.

There is provision for the beam deflection unit to be brought from an initial position into different deflected positions. The deflected positions are held for a respective prescribed determined period. Preferably, the beam deflection unit is returned to the initial position after each deflected position.

Preferably, the beam deflection unit is moved such that the optical communication signal is deflected from the initial position in four different directions. The order in which the deflection positions are adopted is stipulated and in one exemplary embodiment is not changed. This movement of the beam deflection unit allows the remote station to determine an influence of the change in the radiation direction of the optical communication signal on the signal quality at the receiver.

Usually, a change in the radiation direction of the optical communication signal results in a change in the intensity or in the amplitude of the signal received at the remote station. If the optical communication signal is optimally oriented to the remote station in the initial position of the beam deflection unit (i.e. the optical communication signal strikes a receiver at its highest intensity), any change in the radiation direction of the optical communication signal leads to a lower intensity or amplitude, i.e. to a lower signal quality at the receiver. If the optical communication signal is not optimally oriented to the remote station in the initial position (i.e. the maximum intensity of the transmitted beam is not concordant with the entrance aperture of the reception system), however, then at least one deflection position leads to the intensity or the amplitude of the received signal being higher than in the initial position. This thus means that the optical communication signal is very likely received by the receiver even if it is not optimally oriented to the remote station. However, the optical communication signal does not have the highest possible intensity in such a case.

The remote station detects the intensity of the received signal. As a result, changes in the intensity are also detected. Likewise, the remote station ascertains the duration of a change in the intensity of the received signal. If the remote station discovers an improvement in the signal quality, the duration of the improved signal quality is also known.

As already stated above, each deflection position of the beam deflection unit is assigned a determined length of time or period, the period for one deflection position differing from the period for any other deflection position. Thus the remote station is able to ascertain the period of an improved signal quality in order to infer that deflection position that has led to the improved signal quality.

In other words, the beam deflection unit is thus guided into different deflection positions for determined periods, and the remote station measures the associated changes in the signal quality and associated periods. The remote station then ascertains whether a deflection position has led to an improvement in the signal quality and determines the duration of the improved signal quality.

So as now to transmit the information about the preferred deflection position to the communication platform, the remote station can change the amplitude of the guidance beam for the duration of the period associated with the preferred deflection position. The communication platform can now measure the period of the changed intensity of the guidance beam and put the beam deflection unit into the preferred deflection position. The preferred deflection position becomes the new initial position, and the steps described herein can be performed again.

In one example, this is as follows: the first deflection position is adopted for one unit of time, the second deflection position is adopted for two units of time, the third deflection position is adopted for three units of time and the fourth deflection position is adopted for four units of time. If the remote station now discovers that there is an improvement in the signal quality for three units of time, then this means that the third deflection position is better than the initial position of the beam deflection unit. The remote station will now model the guidance beam such that the amplitude of the guidance beam is likewise changed for three units of time. By way of example, the amplitude of the guidance beam can be increased or reduced. The communication platform now has information to the effect that the third deflection position leads to a better signal quality than the initial position, and puts the beam deflection unit into the third deflection position. Starting from this point, the beam deflection unit can be put into the first to fourth deflection positions again. It is thus possible for the beam deflection unit to be brought closer to an optimum position in steps.

The approach described here allows the orientation of the beam deflection unit to be tuned to a remote station. In particular, this approach describes fine tuning in unidirectional communication arrangements. If a data connection does not exist between the remote station and the communication platform, there is no return channel in order to transmit the effect of the deflection positions on the signal quality at the remote station to the communication platform. In the present case, this is resolved by virtue of the intensity of a guidance beam between remote station and communication platform being changed and the communication platform being able to infer a preferred deflection position of the beam deflection unit from the duration of the changed intensity. It should be pointed out that a guidance beam for an optical communication connection between receiver and transmitter is not regarded as a data channel for the purposes of this description.

According to one embodiment, the control unit is designed to actuate the beam deflection unit such that the optical communication signal is deflected along the first line of movement or the second line of movement by an identical absolute value of the deflection angle during each deflection process.

By way of example, the deflection angle may be 2 μrad. Generally, the deflection angle is chosen such that a connection between the communication platform and the remote station is not terminated or interrupted. That is to say that the deflection angle is chosen to be sufficiently small for the remote station not to be in a deflection position outside the beam cone of the optical communication signal. In particular, the deflection angle is smaller than the divergence of the optical communication signal.

The deflection angle is determined for each deflection position starting out from the initial position. This means that the deflection positions are arranged at a uniform angular distance from the initial position.

According to a further embodiment, the first line of movement and the second line of movement run linearly and intersect one another at an angle of 90°.

This means that, starting from the initial position, the optical communication signal is first moved to the left, then returned to the initial position and then moved to the right and returned to the initial position again. This scheme is subsequently repeated in the upward and downward directions. The two lines of movement are orthogonal relative to one another.

According to a further embodiment, each of the second period, the third period and the fourth period is an integer multiple of the first period. In addition, each period differs from any other period, i.e. each period has an explicit duration.

This allows solely the duration of a change in the signal quality to be taken as basis for inferring the associated deflection position.

According to a further embodiment, the emitter is a laser source having a single-mode characteristic. However, it is also possible to use multimode laser sources.

According to a further embodiment, the control unit is designed to actuate the actuator such that the beam deflection unit is deflected in the first and second directions along the first line of movement and in the first and second directions along the second line of movement in a prescribed order.

This means that the order of the deflection positions of the beam deflection unit is known and no longer needs to be communicated to the remote station separately and also does not need to be known to the remote station in the first place. Rather, it is sufficient for the communication platform to have ready an association between deflection position and period. If the remote station discovers an improvement in the signal quality and modulates the guidance beam for a particular period, then the communication platform can ascertain this period and use its own association to ascertain the associated deflection position of the beam deflection unit. For this purpose, the communication platform can use an association table that the control unit stores in a memory.

By way of example, the control unit may be a computer that has a processor and a memory. The processor is designed to execute coded instructions and to perform the functions associated with the control unit. In this regard, the processor can access the memory in order to store information in the memory or to read information from the memory.

The processor may be a microcontroller or a programmable logic gate (e.g. an FPGA, field programmable gate array). The memory may be a volatile or persistent memory unit.

According to a further embodiment, the control unit is designed to actuate the actuator such that after each deflection process the beam deflection unit is brought into an initial position before the next deflection position is adopted.

According to a further embodiment, the communication platform is a satellite.

From the communication platform, it is possible for a communication connection to a remote station to be set up. The remote station may be another satellite, an aircraft or a mobile or static remote station on the Earth's surface.

According to a further aspect, a communication system is specified. The communication system has a communication platform as described above and below and a remote station. The remote station is designed to send the guidance beam in the direction of the communication platform. The remote station is further designed to detect intensity fluctuations of the optical communication signal and the duration of these intensity fluctuations and to determine that intensity fluctuation of the optical communication signal that has the best signal quality and the duration of this intensity fluctuation. The remote station is further designed to change an intensity of the guidance beam for the duration of the intensity fluctuation of the optical communication signal. The communication platform is designed to take the duration of the intensity fluctuation of the guidance beam as a basis for ascertaining that deflection direction of the optical communication signal that is consistent with the duration of the intensity fluctuation of the guidance beam.

Thus, the communication platform is capable of tuning a unidirectional optical transmission link to the remote station without there being a data connection from the remote station to the communication platform. Rather, the guidance beam emanating from the remote station is used to signal to the communication platform, by changing the intensity of the guidance beam, what deflection position of the optical communication signal has led to an improvement in the signal quality at the remote station.

According to one embodiment, the communication platform is designed to deflect the beam deflection unit and put it into a target position after receiving the intensity fluctuation of the guidance beam.

The target position is consistent with that deflection position that has led to the best signal quality at the remote station. Starting from this target position, the beam deflection unit can be moved into different deflection positions again in order to find a possible further improvement in the signal quality.

If the optical communication signal is already optimally oriented to the remote station, any deflection position leads to a lower signal quality. In such a case, the remote station can completely dispense with changing the intensity of the guidance beam. Alternatively, the guidance beam can be modulated in a previously stipulated pattern in order to indicate to the communication platform that a further change in the radiation direction of the optical communication signal is not necessary.

The steps performed in order to bring the beam deflection unit from one initial position into the next initial position can be referred to as tuning steps. Each tuning step provides for the beam deflection unit to be brought into different deflection positions, one of which is selected as the next initial position. Multiple such tuning steps can be referred to as a tuning cycle. By way of example, a tuning cycle can end after a further improvement in the signal quality can no longer be achieved. A tuning cycle can alternatively contain a firmly prescribed number of tuning steps, e.g. five tuning steps. A tuning cycle can be repeated after several minutes in order to perform fine tuning of the radiation direction of the optical communication signal to the remote station.

According to a further embodiment, the communication platform is designed to move the beam deflection unit in the first direction (first deflection position) along the first line of movement and subsequently in the second direction (second deflection position) along the first line of movement and also in the first direction (third deflection position) along the second line of movement and subsequently in the second direction (fourth deflection position) along the second line of movement after the beam deflection unit has been put into the target position, so as thereby to ascertain a customized target position.

This embodiment states that multiple tuning steps are performed in succession. A tuning step sets out from an initial position and results in a target position for the beam deflection unit.

According to a further aspect, a method for adjusting a radiation direction of an optical communication signal between a communication platform and a remote station is specified. The method has the following steps: starting from an initial position of a beam deflection unit of the communication platform for steering the optical communication signal, deflection positions of the beam deflection unit along two different lines of movement and in opposite directions along the lines of movement are adopted, wherein the deflection positions are consistent with deflection angles having the same absolute value and each deflection position is held for a different period; measuring an intensity of the optical communication signal at the remote station; as soon as an intensity change in the optical communication signal is discovered at the remote station, a signal quality change in the optical communication signal is ascertained and a duration of this intensity change is recorded; determining that intensity change that pertains to the best signal quality change, and the associated duration; changing the intensity of a guidance beam for the duration determined in the previous step.

The explanations presented in connection with the communication platform and the communication system apply in the same manner mutatis mutandis to the method described herein. This means that functions of the communication platform and of the communication system can be implemented as method steps.

According to one embodiment, the method additionally has the following steps: recording, on the communication platform, the duration of the intensity change in the guidance beam; and moving the beam deflection unit to that deflection position that was adopted for the duration of the intensity change in the guidance beam.

In this step, the communication platform compares the duration of the intensity change in the guidance beam with the periods of the deflection positions. This ascertains which deflection position has led to the best signal quality at the remote station. The beam deflection unit can then be moved into the next initial position for the next tuning step.

According to a further embodiment, the method steps are repeated until that deflection position of the beam deflection unit that is consistent with the maximum signal quality has been ascertained along a first line of movement.

By way of example, the beam deflection unit can first be brought along the first line of movement (for example in a horizontal direction) to that point at which the signal quality is at a maximum. This point is discovered by virtue of a movement of the beam deflection unit in one direction initially leading to a rising signal quality, but the signal quality decreasing again from a certain point onwards. The position before the signal quality decreases again is consistent with the maximum signal quality in the horizontal direction.

According to a further embodiment, the method steps are repeated until that deflection position of the beam deflection unit that is consistent with the maximum signal quality has been ascertained in a second line of movement.

The action described above for the first line of movement is also repeated mutatis mutandis for the second line of movement (in a vertical direction).

Naturally, the beam deflection unit can also be alternately tuned in the horizontal or vertical direction or in the order that promises the best change in the signal quality.

In other words, the approach presented here can be described as follows:

An optical connection having a diffraction-limited beam is reliant on a signal from the remote terminal that is used for orienting its own reception system and transmission system. Even if its own system is not equipped for receiving data, it has what is known as a tracking system that uses a guidance beam to detect a disparity in the reception direction from the hypothetical transmission direction. In addition, diffraction-limited systems contain an adjusting mechanism (beam deflection unit and actuator), which is independent of the reception direction, for the angle of the emerging beam (in order to set e.g. a lead angle). A characteristic of such systems is that they detect intensity fluctuations and can evaluate them. The approach presented here involves an evaluation of these intensities.

The approach described here allows the radiation direction of the optical signal carrier to be adjusted in systems without a dedicated optical receiver. In particular, exclusively functions that are also required for maintaining laser communication are used. In addition, the configuration of the time intervals and durations allows flexible reaction to particular circumstances of the transmission link. For example, it is known that laser connections suffer from irregular disturbances in the light intensity (scintillations, beam migration) which have a typical time constant of a few milliseconds, as a result of the atmosphere. If the time interval of the signalling is chosen to be of the corresponding length, the influence of the atmosphere can be greatly suppressed by averaging, for example. This is particularly relevant in the case of laser communication connections to ground stations or aircraft, both among one another and therefrom to satellites.

BRIEF DESCRIPTION OF THE DRAWINGS

Further exemplary embodiments and advantages of the invention are obtained from the description of the figures that follows. In different figures, the same or similar elements are provided with the same or similar reference signs.

The depictions in the figures are schematic and not to scale.

In the figures:

FIG. 1 shows a schematic depiction of a communication system;

FIG. 2 shows a schematic depiction of a communication platform;

FIG. 3 shows a schematic depiction of the tuning of a radiation direction;

FIG. 4 shows a schematic depiction of the intensity of an optical communication signal in different deflection positions;

FIG. 5 shows a schematic depiction of a method.

DETAILED DESCRIPTION

Figure 1:
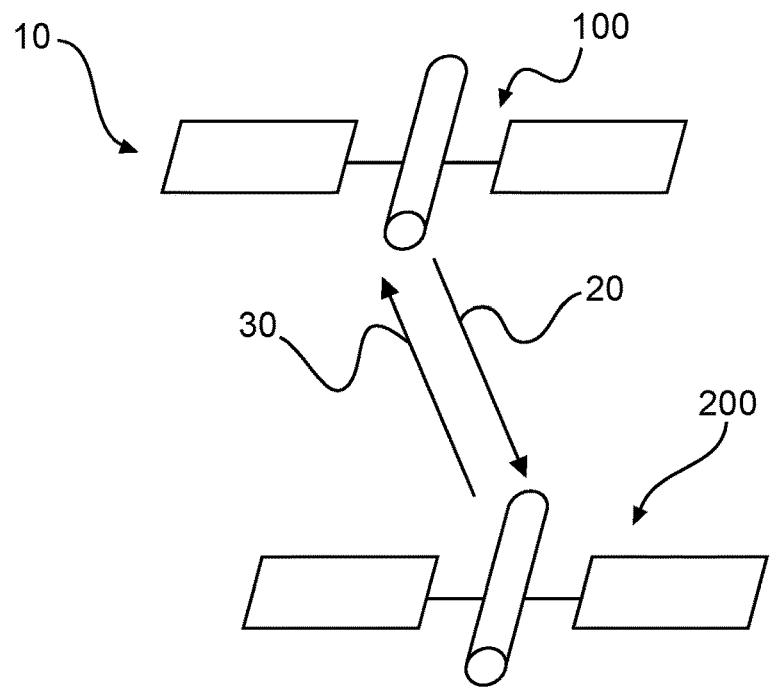

FIG. 1 shows a communication system 10 having a first communication platform 100 and a second communication platform 200. The first communication platform 100 can be referred to as a transmitter and the second communication platform 200 can be referred to as a receiver or remote station.

The first communication platform 100 and the second communication platform 200 have a unidirectional optical transmission link set up between them. This transmission link consists of a data connection 20, which can be referred to as an optical communication signal or useful signal. The data connection 20 is a directional data connection from the first communication platform 100 to the second communication platform 200. In addition, a guidance beam 30 is emitted by the second communication platform 200 in order to allow the first communication platform 100 to detect the position of the second communication platform.

The first communication platform 100 may be a satellite that is in orbit. The second communication platform 200 may likewise be a satellite in an orbit, but also an aircraft in the Earth's atmosphere or a mobile or static remote station on the Earth's surface.

There is provision for the first communication platform 100, after a time depending on the system properties (several minutes), to begin a sequence of systematic variations in the transmission angle with reference to the reception direction. These variations in the transmission angle envisage the beam deflection unit being brought into the deflection positions described above. These variations are e.g. orthogonal in relation to one another, and the direction in the coordinate system of the transmitter (the first communication platform 100) is coded over the duration of the disparity (the period during which the beam deflection unit is in a particular deflection position).

The receiver (the second communication platform 200) at the other end detects the duration and level of the intensity fluctuation and conversely signals (for example likewise by changing the lead angle, or by varying the output power of the guidance beam 30) that direction that has led to the increase in the reception intensity. This information is then used to readjust the lead angle of the optical communication signal 20, and if need be the procedure is repeated multiple times.

It is conceivable for two unidirectional data connections to exist between the first communication platform 100 and the second communication platform 200, wherein the transmission units and reception units of a communication platform are isolated from one another in terms of function, so that each of these two unidirectional data connections consists only of an outgoing channel and there is no provision for an associated return channel. In such a scenario, the steps for tuning the beam deflection units of the two communication platforms can be performed in succession.

Figure 2:
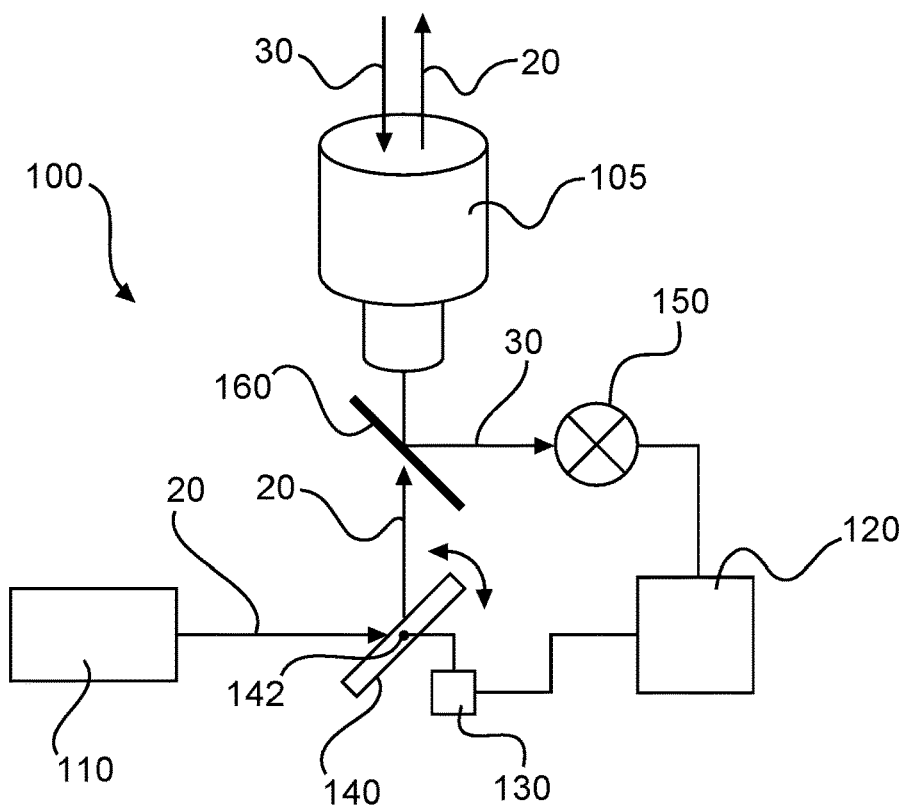

FIG. 2 shows a schematic depiction of a communication platform 100. The communication platform 100 has an emitter 110 that generates an optical signal 20 from a data signal (not shown). The optical signal 20 is emitted and strikes the surface of the beam deflection unit 140. The optical signal 20 is reflected by the surface of the beam deflection unit 140, passes through a beam splitter 160 and then leaves the communication platform 100 via the transmission/reception optical system 105.

The transmission/reception optical system 105 outputs the communication signal 20. Conversely, the transmission/reception optical system 105 receives the guidance beam 30. The guidance beam 30 is deflected onto an intensity detector 150 by the beam splitter 160.

The beam deflection unit 140 is swivellable about a pivot point 142. In particular, the pivot point 142 allows the beam deflection unit to be swivelled with two degrees of freedom, that is to say such that the optical communication signal can be moved along two different lines of movement (up/down and left/right or horizontally and vertically).

An actuator 130, e.g. having one or more electric motors, is intended to move the beam deflection unit 140. The actuator 130 is controlled by the control unit 120. The control unit 120 prescribes in which direction and to what angular extent the beam deflection unit 140 is supposed to be moved. Additionally, the control unit 120 is coupled to the intensity detector 150 and is designed to obtain information about the intensity of the guidance beam 30. This information can be requested by the control unit 120 or sent by the intensity detector 150. Additionally, the control unit 120 can determine the duration of intensity changes.

It is conceivable for the optical path (the path of the signals 20 and 30) to be modified and the approach described here nevertheless to be implemented. As such, it is conceivable, by way of example, for two beam deflection units to be arranged in the optical path. Besides the beam deflection unit 140 shown, a second beam deflection unit may be arranged between transmission/reception optical system 105 and the beam splitter 160. This second beam deflection unit can, in principle, perform the same function as the beam deflection unit 140. However, one of these two beam deflection units may be designed to compensate for microvibrations in the communication platform 100 or for other relatively fast disparities in the optical signal, whereas the other beam deflection unit is then designed to adopt a static lead angle. The static lead angle can be held over a longer period of a few minutes to a few hours in order to take into consideration present transmission properties.

The second beam deflection unit can also have an actuator that can adjust or prescribe the orientation of the second beam deflection unit.

The control unit 120 can control both beam deflection units. In this case, the mechanism described with reference to FIG. 3 to 5 can be used for both beam deflection units or else just for one of the two in order to ascertain an optimum adjustment angle for the emitted optical signal.

Figure 3:
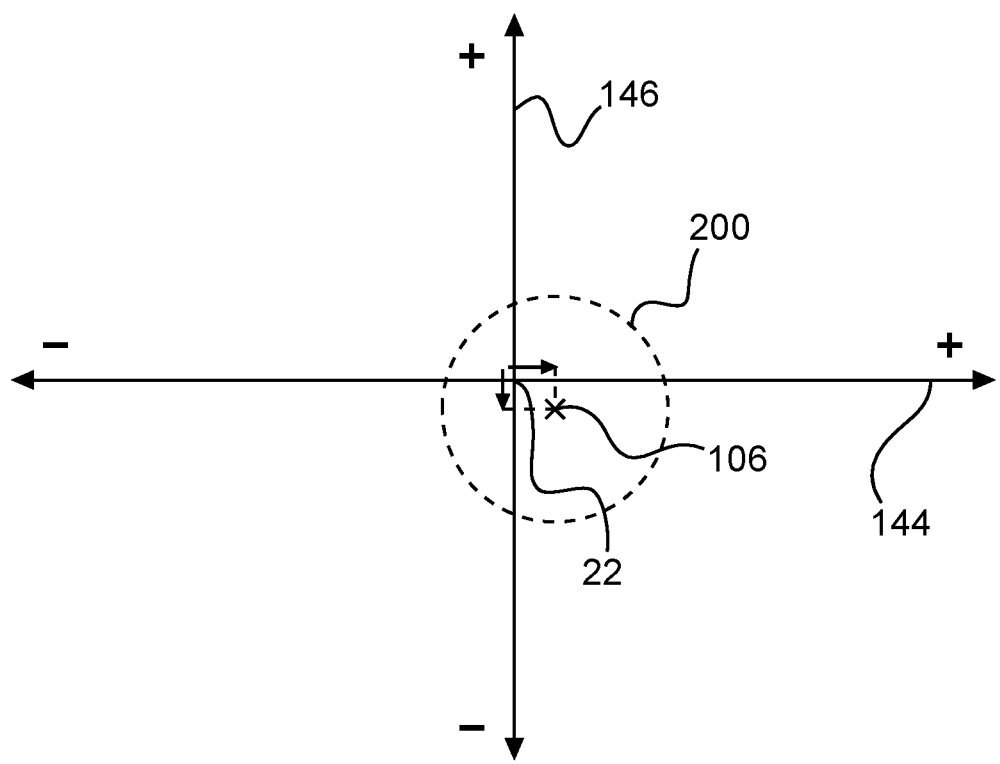

FIG. 3 schematically illustrates how an orientation of the optical communication signal from the first communication platform with reference to a second communication platform 200 is moved in order to obtain an optimum orientation.

Of the second communication platform 200, only a reception sensitivity is shown as a broken circle. In addition, a present target 22 of the optical communication signal is shown. This depiction is intended to be understood to mean that the intensity of the received optical signal is highest when the target 22 is central in the reception sensitivity, that is to say when the optical signal is directed at a reception apparatus such that the reception apparatus is in the area of highest intensity of the optical signal. Although the present target is directed at the second communication platform, it is slightly offset from the centre of the transmission and reception optical system 105. This lateral offset can lead to the signal quality (signal level) at the receiver being lower than the maximum possible. Customizing the orientation of the optical communication signal can improve the signal quality. This would require the communication signal to be oriented to the centre of the transmission and reception optical system 105. Generally, the communication signal is oriented such that the highest possible signal quality is achieved.

The depiction in FIG. 3 shows two lines of movement 144, 146, one of which is referred to as a horizontal line of movement or first line of movement 144 and the other of which is referred to as a vertical line of movement or second line of movement 146. Starting from the initial position 22 (present orientation of the beam deflection unit), the beam deflection unit is moved upwards, to the left, downwards, to the right in a prescribed order and through a prescribed deflection angle. If one of these deflection movements leads to an improvement in the signal quality at the receiver, the beam deflection unit is moved in the applicable direction and adopts a new position, starting from which the deflection movements are performed again.

Possible movements of the beam deflection unit are shown as two arrows pointing to the right and downwards close to the point of intersection of the lines of movement 144, 146. With these two movements, the optical communication signal approaches the centre 106.

A positive and a negative direction of movement is indicated on each of the two lines of movement.

Figure 4:
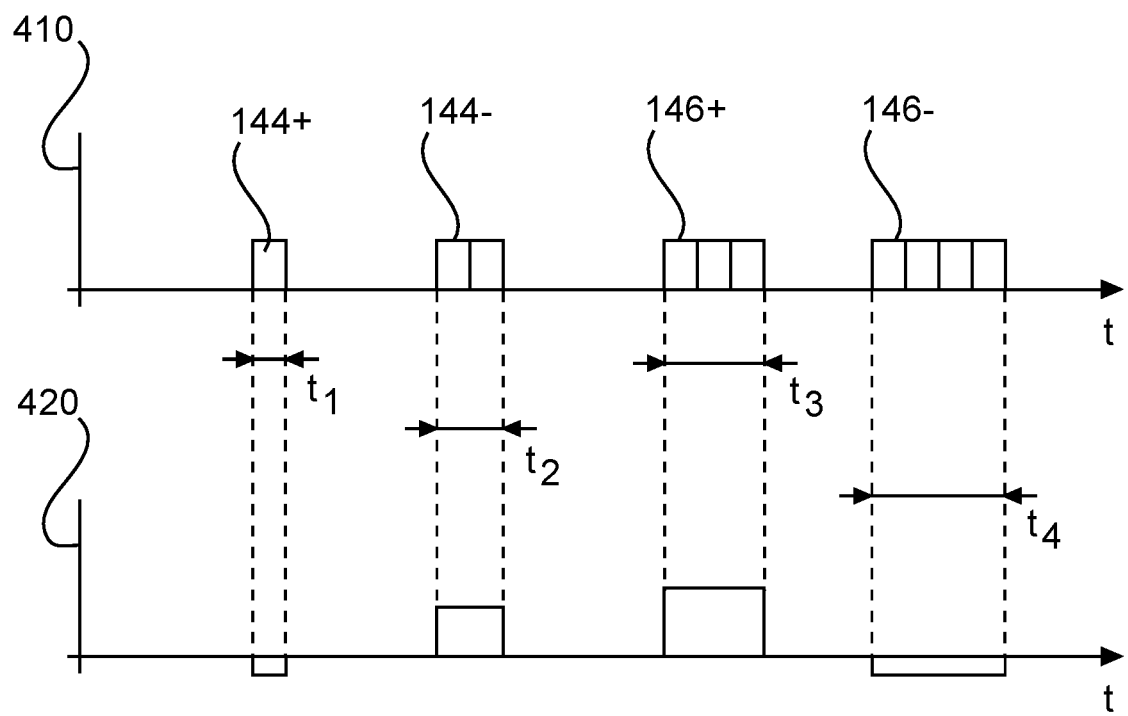

FIG. 4 shows two graphs. The top graph shows an absolute value of the deflection angle over time, the direction of the deflection angle being indicated as a reference sign. The beam deflection unit is first of all moved in a positive direction along the line of movement 144 (that is to say in the right in FIG. 3) and remains in this deflection position for the period t1. The beam deflection unit is then moved back to the initial position and subsequently in a negative direction along the line of movement 144 (to the left in FIG. 3) into the second deflection position for the period t2. The movement along the line of movement 146 is effected similarly: first in a positive direction (upwards in FIG. 3) for the period t3 and then in a negative direction (downwards in FIG. 3) for the period t4.

The bottom graph in FIG. 4 shows the change in the signal intensity at the receiver. In period t1, the intensity falls. This means that the relevant deflection position leads to a worsening of the signal quality. In periods t2 and t3, there are improvements in the signal quality, the best signal quality being achieved in period t3. Period t4 in turn has a poorer signal quality. In the present case, this means that the beam deflection unit is moved to the position it was in in period t3. The tuning is then repeated.

It is also conceivable for the beam deflection unit to be continuously moved in a circle, and the remote station responds by changing the intensity of the guidance beam 30 when a maximum intensity has been reached. This maximum is typically detected by virtue of the intensity first of all rising before falling again. If the communication platform 100 receives an intensity change in the guidance beam, then it can be inferred that the maximum was reached before a particular period and the beam deflection unit can be moved back by an angular extent. The beam deflection unit 140 can travel along a circle having a diameter of 2 μrad, for example. This circle can be traveled along so slowly that the delay as a result of the propagation delay of the guidance beam and the time that elapses in order to determine the maximum intensity as such is negligible. The propagation delay of the guidance beam can be calculated on the basis of the known distance between the communication platform and the remote station.

Figure 5:
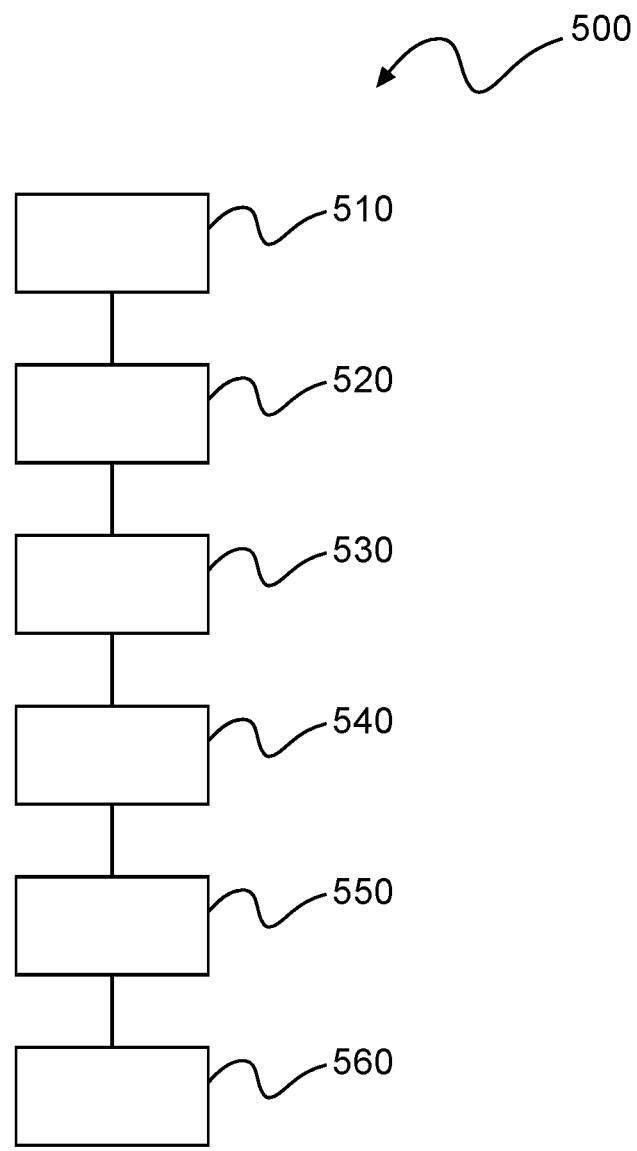

FIG. 5 shows the steps of a method 500 for adjusting a radiation direction of an optical communication signal between a communication platform and a remote station. The method has the following steps: bringing a beam deflection unit into an initial position in step 510; starting from the initial position of the beam deflection unit of the communication platform for steering the optical communication signal, adopting deflection positions of the beam deflection unit along two different lines of movement and in opposite directions along the lines of movement in step 520, wherein the deflection positions are consistent with deflection angles having the same absolute value, and each deflection position is held for a different period; measuring an intensity of the optical communication signal at the remote station in step 530; as soon as an intensity change in the optical communication signal is discovered at the remote station, ascertaining a signal quality change in the optical communication signal and recording the duration of this intensity change in step 540; determining that intensity change that pertains to the best signal quality change, and the associated duration, in step 550; changing the intensity of a guidance beam for the duration determined in the previous step in step 560.

The best signal quality change is considered to be that change that leads to the largest improvement in the signal quality in terms of absolute value. The signal quality can be determined using known suitable methods in this case.

The method is preferably performed with a communication system and a communication platform and also a remote station as described in FIG. 1 to FIG. 4.

Additionally, it should be pointed out that "having" or "comprising" does not exclude other elements or steps and that "a" or "an" does not exclude a multiplicity. Further, it should be pointed out that features or steps that have been described with reference to one of the exemplary embodiments or configurations above can also be used in combination with other features or steps of other exemplary embodiments or configurations described above. Reference signs in the claims are not intended to be regarded as a limitation.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

REFERENCE SIGNS

10 Communication system
20 Data connection, communication signal
22 Target of the optical data connection
30 Guidance beam
100 First communication platform
105 Transmission/reception optical system
106 Centre of the transmission/reception optical system
110 Emitter
120 Control unit
130 Actuator
140 Beam deflection unit
142 Pivot point
144 First line of movement (with two directions)
146 Second line of movement (with two directions)
150 Intensity detector
160 Beam splitter
200 Second communication platform
410 Absolute value of the deflection angle
420 Intensity change in the received data connection
500 Method
510-560 Method steps

The invention claimed is:

1. A communication platform, comprising:
an emitter for generating an optical communication signal;
an intensity detector for detecting an intensity of a guidance beam;
a beam deflection unit for steering the optical communication signal in the direction of a remote station;
an actuator for rotating the beam deflection unit about a pivot point; and
a control unit for actuating the actuator;
wherein the control unit is configured:
to actuate the actuator such that the optical communication signal is deflected by the beam deflection unit in a first direction along a first line of movement for a prescribed first period and is subsequently deflected in a second direction along the first line of movement, opposite to the first direction of the first line of movement, for a prescribed second period;
to actuate the actuator such that subsequently the optical communication signal is deflected by the beam deflection unit in a first direction along a second line of movement for a prescribed third period and is subsequently deflected in a second direction along the second line of movement, opposite to the first direction of the second line of movement, for a prescribed fourth period; and
to obtain a first intensity, a second intensity, a third intensity, and a fourth intensity of the guidance beam as detected by the intensity detector for the first prescribed period, the second prescribed period, the third prescribed period, and the fourth prescribed period, respectively, and to take the detected intensities as a basis for determining a deflection direction of the beam deflection unit along the first line of movement or the second line of movement and to put the beam deflection unit into a deflection position.

2. The communication platform according to claim 1, wherein the control unit is configured to actuate the beam deflection unit such that the optical communication signal is deflected along the first line of movement or the second line of movement by an identical absolute value of the deflection angle during each deflection process.

3. The communication platform according to claim 1, wherein the first line of movement and the second line of movement run linearly and intersect one another at an angle of 90°.

4. The communication platform according to claim 1, wherein each of the second period, the third period and the fourth period are integer multiples of the first period and each differ from one another.

5. The communication platform according to claim 1, wherein the control unit is configured to actuate the actuator such that the beam deflection unit is deflected in the first and second directions along the first line of movement and in the first and second directions along the second line of movement in a predetermined order.

6. The communication platform according to claim 1, wherein the control unit is configured to actuate the actuator such that after each deflection process the beam deflection unit is brought into an initial position before the next deflection position is adopted.

7. The communication platform according to claim 1, wherein the communication platform is a satellite.

8. A communication system, comprising:
the communication platform according to claim 1; and
the remote station;
wherein the remote station is configured to send the guidance beam in the direction of the communication platform,
wherein the remote station is configured to detect intensity fluctuations of the optical communication signal and the duration of these intensity fluctuations,
wherein the remote station is configured to determine that intensity fluctuation of the optical communication signal that has the best signal quality and the duration of this intensity fluctuation,
wherein the remote station is configured to change an intensity of the guidance beam for the duration of the intensity fluctuation of the optical communication signal, and
wherein the communication platform is configured to take the duration of the intensity fluctuation of the guidance beam as a basis for ascertaining that deflection direction of the optical communication signal that is consistent with the duration of the intensity fluctuation of the guidance beam.

9. The communication system according to claim 8, wherein the communication platform is configured to deflect the beam deflection unit and put it into a target position after receiving the intensity fluctuation of the guidance beam.

10. The communication system according to claim 9, wherein the communication platform is configured to move the beam deflection unit in the first direction along the first line of movement and subsequently in the second direction along the first line of movement and also in the first direction along the second line of movement and subsequently in the second direction along the second line of movement after the beam deflection unit has been put into the target position, so as thereby to ascertain a customized target position.

* * * * *

UNITED STATES PATENT AND TRADEMARK OFFICE
CERTIFICATE OF CORRECTION

PATENT NO. : 10,606,146 B2  
APPLICATION NO. : 16/163762  
DATED : March 31, 2020  
INVENTOR(S) : Frank Heine Page 1 of 1

It is certified that error appears in the above-identified patent and that said Letters Patent is hereby corrected as shown below:

On the Title Page

(30) Foreign Application Priority Data:  
Nov. 24, 2017 (DE).................. delete "10 2017 127 913" and insert therefore --10 2017 127 813.3--

Signed and Sealed this  
Twelfth Day of May, 2020

Andrei Iancu  
*Director of the United States Patent and Trademark Office*